United States Patent [19]

Paulo

[11] Patent Number: 4,775,336
[45] Date of Patent: Oct. 4, 1988

[54] CONTACT INSERTION FEATURE

[75] Inventor: James A. Paulo, Harrisburg, Pa.

[73] Assignee: AMP Incorporated, Harrisburg, Pa.

[21] Appl. No.: 94,944

[22] Filed: Sep. 9, 1987

Related U.S. Application Data

[60] Division of Ser. No. 12,100, Feb. 6, 1987, which is a continuation-in-part of Ser. No. 806,149, Dec. 6, 1985, abandoned.

[51] Int. Cl.⁴ ............................................. H01R 13/05
[52] U.S. Cl. .................................... 439/830; 439/885
[58] Field of Search ............... 439/830, 831, 834, 835, 439/885

[56] References Cited

U.S. PATENT DOCUMENTS

| | | | |
|---|---|---|---|
| 3,074,155 | 1/1963 | Cootes et al. | 29/206 |
| 3,135,147 | 6/1964 | Curtis et al. | 81/52.35 |
| 3,503,036 | 3/1970 | Desso et al. | 339/258 |
| 3,533,054 | 10/1970 | Spriggs et al. | 339/221 |
| 3,669,054 | 6/1972 | Desso et al. | 113/119 |
| 3,806,859 | 4/1974 | Madarasz et al. | 439/712 |
| 3,964,816 | 6/1976 | Narozny | 339/99 R |
| 4,090,772 | 3/1978 | Goodman | 339/258 R |
| 4,529,260 | 7/1985 | Smith | 439/682 |

FOREIGN PATENT DOCUMENTS 2024539  1/1980  United Kingdom .

OTHER PUBLICATIONS

Pamphlet HB 5483, 4. A Closer Look at Mag-Mate Termination Tooling, p. 22.

Primary Examiner—Joseph H. McGlynn
Attorney, Agent, or Firm—David L. Smith

[57]  ABSTRACT

This invention relates to terminal contacts for electrical connectors and in particular one aspect of the invention relates to socket contacts formed in strip on close centerline spacing and another aspect of the invention relates to an insertion feature to facilitate insertion of terminal contacts into an electrical connector housing.

16 Claims, 9 Drawing Sheets

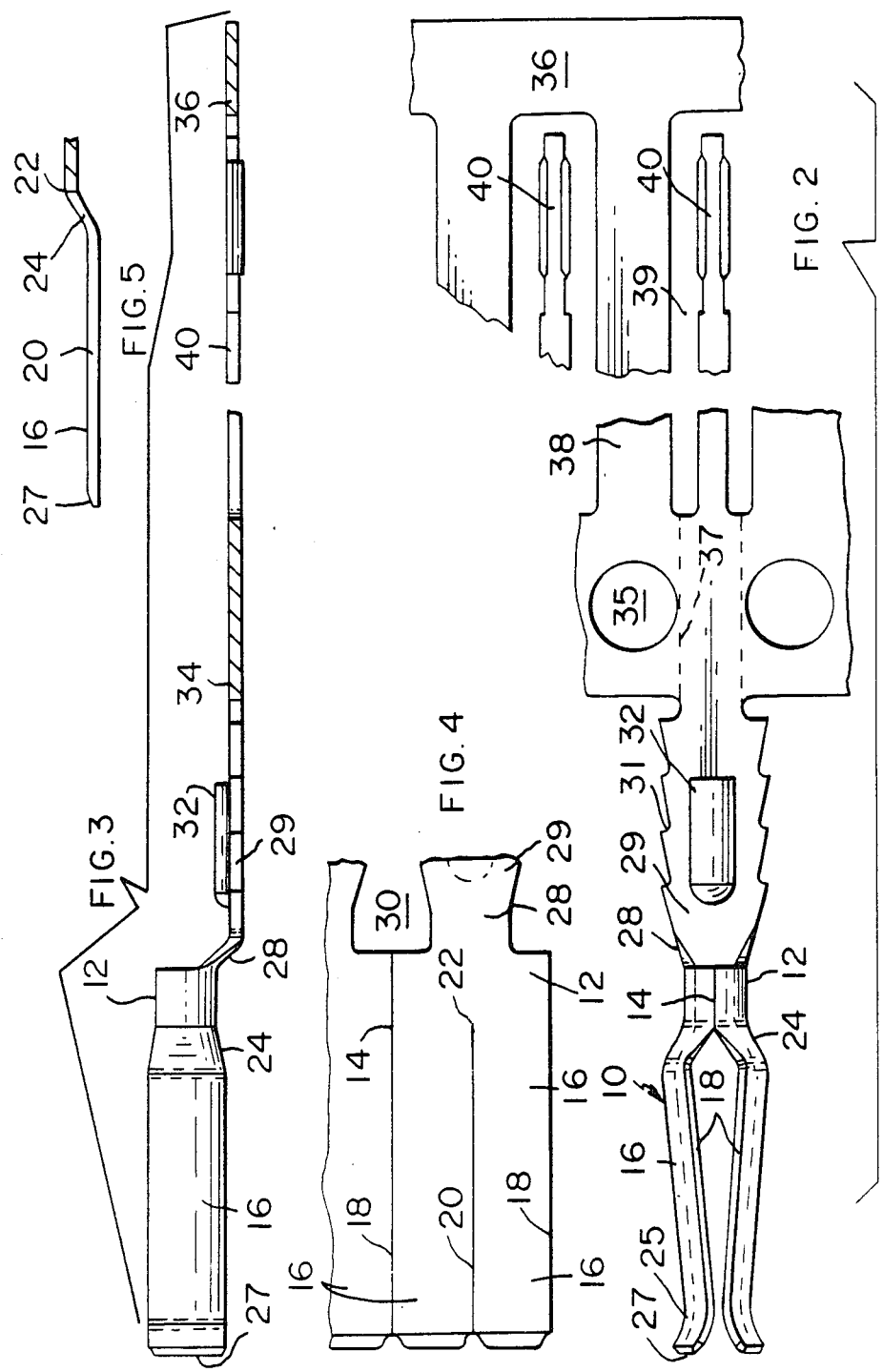

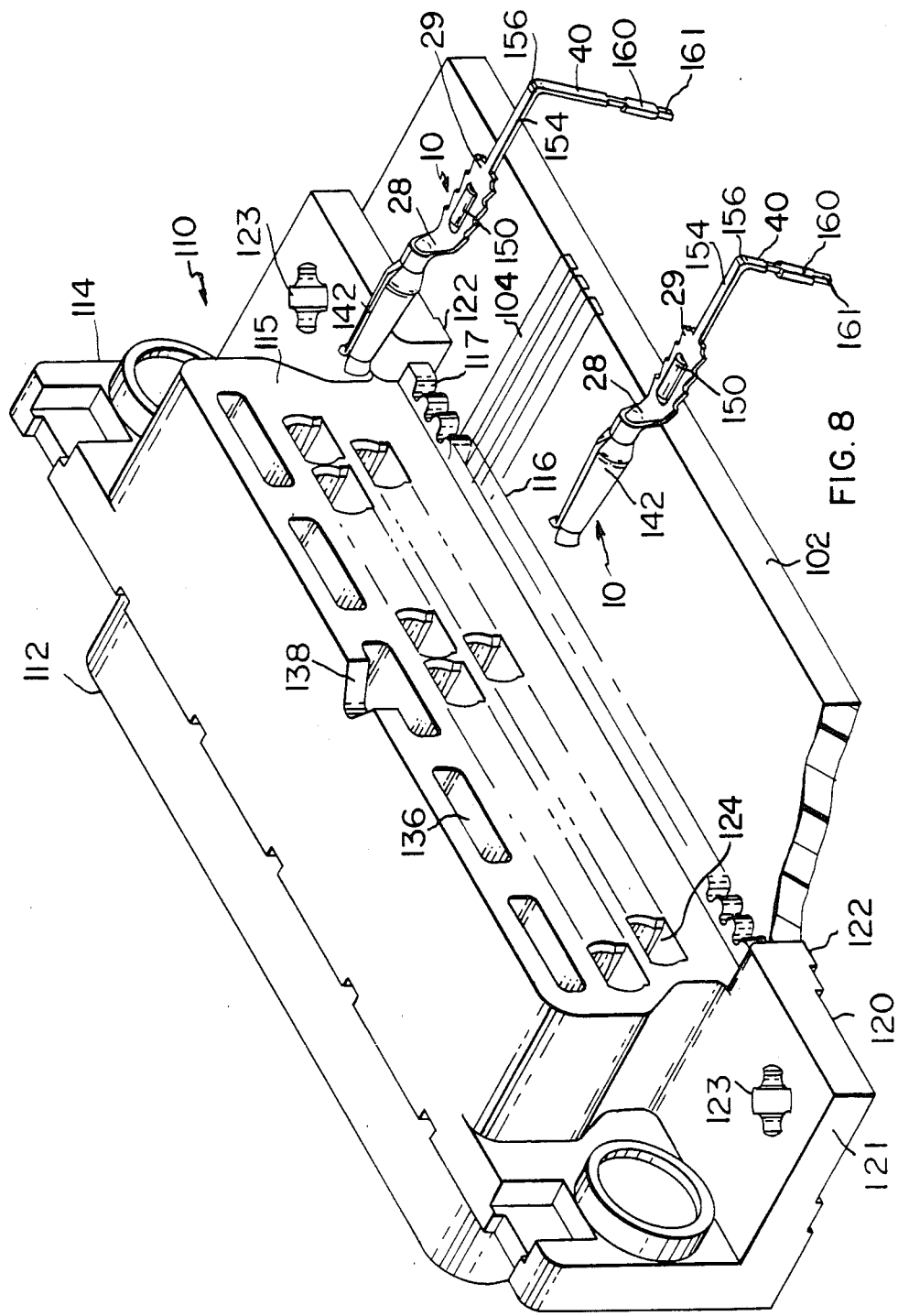

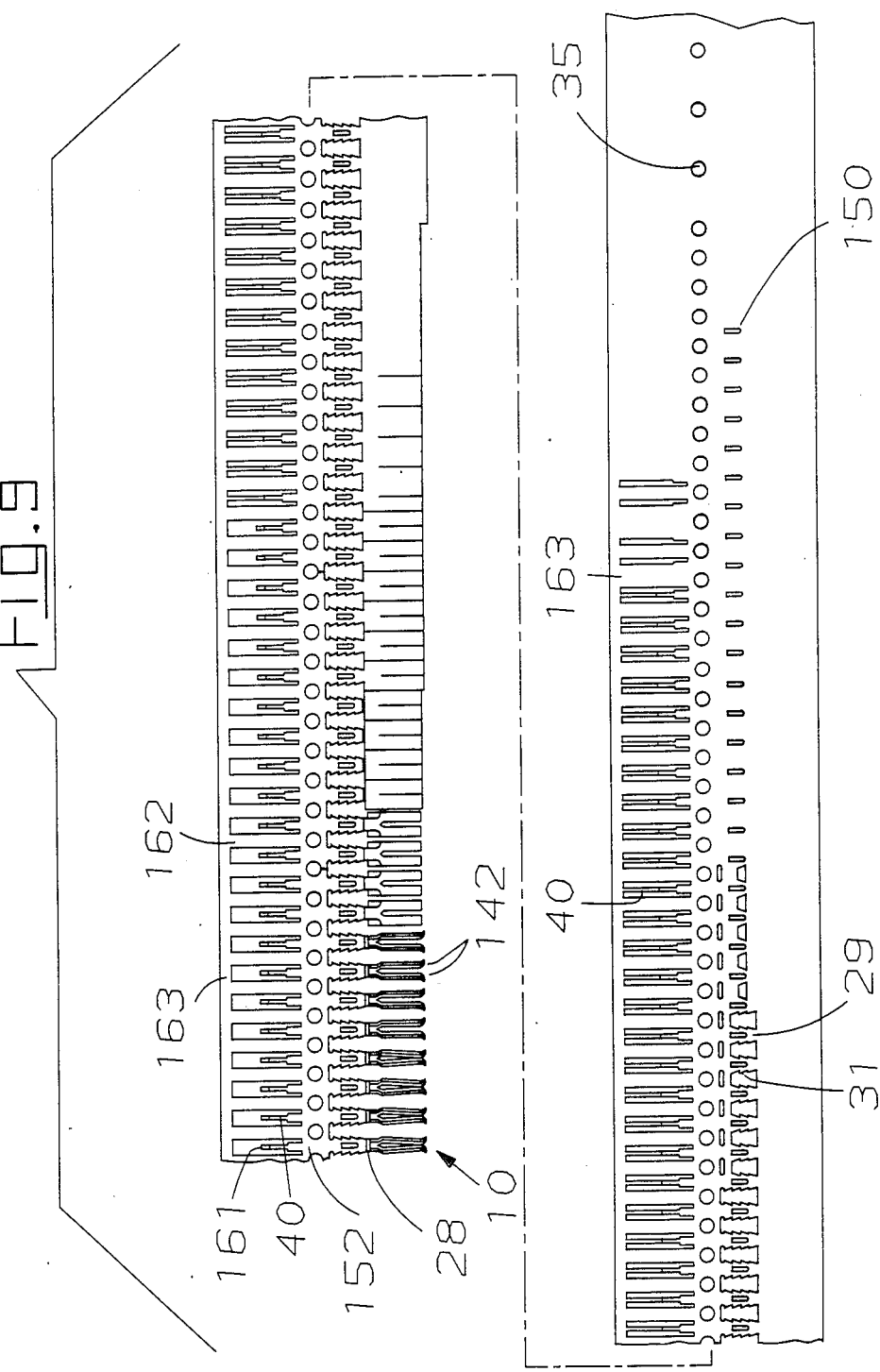

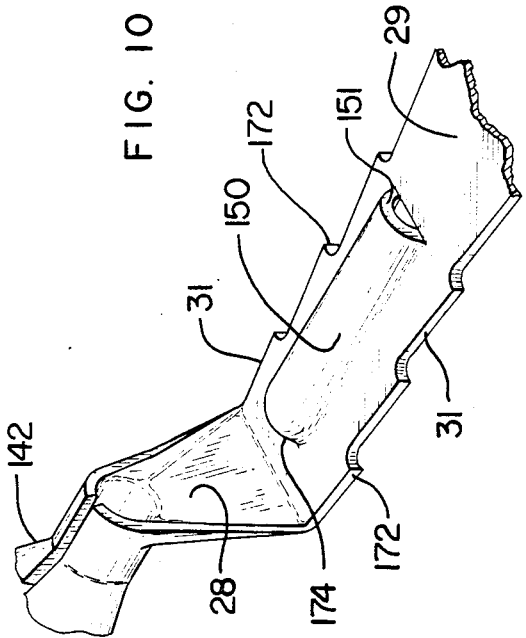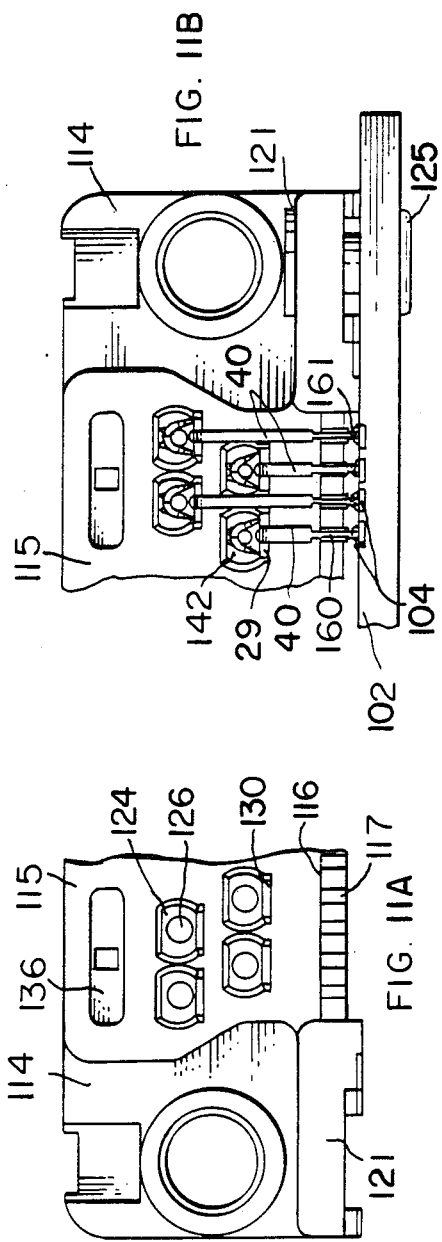

CONTACT INSERTION FEATURE

CROSS REFERENCE TO RELATED APPLICATION

This is a divisional application of Ser. No. 012,100 filed Feb. 6, 1987, which is a continuation-in-part application of application Ser. No. 806,149 filed Dec. 6, 1985, now abandoned.

BACKGROUND OF INVENTION

This invention relates to terminal contacts for electrical connectors and in particular one aspect of the invention relates to socket contacts formed in strip on close centerline spacing and another aspect of the invention relates to an insertion feature to facilitate insertion of terminal contacts into an electrical connector housing.

Known socket contacts used in connectors of the type disclosed in U.S. Pat. No. 4,512,618 are stamped and formed with major rolled surfaces and sheared edges. The contacts are of the type comprising the pair of cantilever arms disposed to form a pin receiving socket therebetween, the arms extending from a common web stamped with opposed first edges, the web being formed into a generally tubular configuration with the edges facing each other. Each arm has a first edge extending from a respective first edge of the web and facing the first edge of the other arm. The arms have respective second edges extending from a common point in the web and facing each other.

In order to resiliently engage the pins, the facing edges of each pair of arms are spaced apart, and the arms converge slightly toward each other between the web and the distal ends. In the known contact, this space is achieved by stamping the first edge of each arm recessed from the shear line of the respective first edge of the web, and by stamping a blank from between the second edges. The web of the formed contact defines the maximum diameter of the socket.

The standard centerline spacing of pin and socket contacts in connectors of the type disclosed in U.S. Pat. No. 4,512,618 is 0.109 inch. Since socket contacts which are stamped in the manner described cannot be manufactured on 0.109 inch centers in strip form, they are generally manufactured on 0.217 inch centers by blanking out the gaps between the contacts. This creates considerable scrap, which is especially undesirable when the mating area of the contacts is gold plated. This permits assembly by overlaying with an identical strip and gang loading, or gang loading alternate contact receiving passages at two successive stations. While some economy of material could be achieved by reducing the centerline spacing, the measure would limit assembly options.

In the prior art, contacts were typically inserted into a terminal receiving passage in the housing of an electrical connector by pushing on an existing vertical surface of the contact such as the web. Since the insertion force was not coplanar with the resistance to insertion, a moment was established in the contact which would cause the leading edge of the contact to skive the interior surface of the passage.

It would be desirable to be able to apply an insertion force to a contact during insertion into a terminal receiving passage without causing the contact to skive the interior surface of the passage. Furthermore, it would be desirable to precisely position the inserted contact upon insertion into a terminal receiving passage.

SUMMARY OF THE INVENTION

According to one aspect of the invention, a stamped and formed socket contact of the type described above is characterized in that the first edge of each cantilever arm is stamped along a rectilinear shear line shared by the respective first edge of the web and the second edge of each arm is stamped along a rectilinear shear line shared by the second edge of the other arm. Spacing between facing edges is achieved by forming the arms with diverging transition portions adjacent to the web, the arms converging between the transition portions and the distal ends.

In a continuous strip of contacts so manufactured, the rectilinear shear line defining the first edge of each arm also defines the first edge of an arm of the adjacent contact in the strip; the shear line likewise defines the edges of respective adjacent webs. There is no blank stamped from between first arms of adjacent contacts. There is likewise no blank stamped from between the second edges of the arm of each contact. This enables a 0.109 inch centerline spacing between contacts on the strip, thus facilitating automated insertion in the connector housing as well as economy in the strip.

In accordance with another aspect of the invention an insertion feature is incorporated in contacts for applying an insertion force to insert the contacts into a terminal receiving passage of an electrical connector without causing the contact to skive the interior surface of the passage. A portion of the strip stock is formed out of the plane of the stock defining a vertical surface facing opposite to the direction of insertion of the contact. The insertion feature is formed alone a length of the contact in the direction of insertion from the vertical surface sufficient to withstand the insertion forces without shearing. The insertion feature substantially transfers the insertion force applied to the vertical surface thereof to be coplanar with the resistance force encountered upon insertion of a terminal into a passage, typically due to securing means on the terminal.

BRIEF DESCRIPTION OF THE DRAWINGS

FIG. 2 is a plan view of the socket;
FIG. 3 is a side view of the socket;
FIG. 4 is a plan view of the strip after shearing;
FIG. 5 is a section view after the first forming operation;
FIG. 8 is a perspective of a connector housing with contacts embodying the insertion feature exploded therefrom;
FIG. 9 is a plan view of a progression of contacts during manufacture;
FIG. 10 is an enlarged perspective view of a portion of a contact showing the insertion feature;
FIG. 11A is a rear view of the housing;
FIG. 11B is a rear view of the housing loaded with contacts and assembled to a printed circuit board.

DETAILED DESCRIPTION OF THE PREFERRED EMBODIMENT

Figure 1:
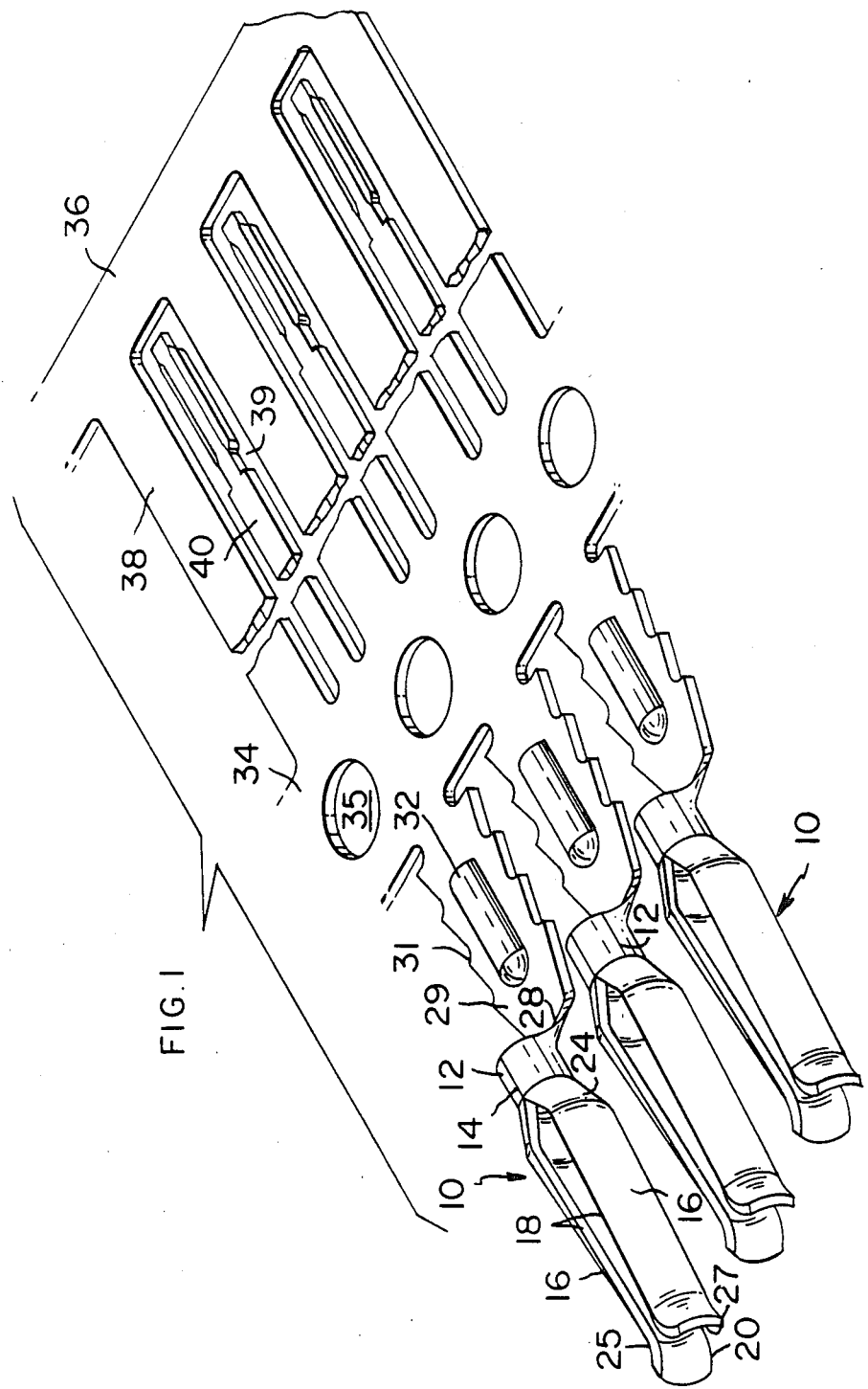
FIG. 1 is a perspective of a strip of socket contacts.

Referring to FIGS. 1, 2, and 3, the socket contacts 10 are in continuous strip form, spced on 0.109 inch centers. Each contact 10 comprises a tubular web 12 with a pair of cantilever arms 16 extending therefrom to distal ends 27. The web 12 has first edges 14 formed into facing relationship and extending to respective first edges 18 of cantilever arms 16. Each arm 16 also has a second edge 20, the second edges 20 extending from a common point 22 and likewise facing each other. The arms 16 are formed with respective transition portions 24 which diverge so that the first edges 18 are spaced apart and the second edges 20 are likewise spaced apart, the arms 16 then converging to constriction 25 where a mated pin is engaged resiliently, and diverging from the constriction 25 to distal ends 27 to facilitate pin reception. A neck 28 extends from web 12 opposite arms 16 to a retaining plate 29 having scallops 31 stamped thereon for retention in the connector housing and a hump 32 to facilitate insertion. Carrier strip 34 has holes 35 for indexing past forming stations prior to shearing along lines 37. Solder tails 40 are defined by stamped apertures 39 between partitions 38, which extend to tail strip 36 and protect the tails 40 prior to shearing along lines 37.

FIG. 4 shows the contact portion of the strip stock after stamping and shearing but prior to forming. Each first edge 14, 18 shares a single rectilinear shear line extending from an edge of the strip stock to a respective aperture 30 stamped between necks. This shear line also defines edges 14, 18 of an arm 16 of the adjacent contact. The second edges 20 of each pair of arms 16 share a single rectilinear shear line extending from the edge of the strip stock to a common point 22 on web 12. This is accomplished by descent of a knife edged shear blade which is received in a die having a slot aligned below the line defining adjacent edges 20. This provides support adjacent point 22 to prevent lateral tearing of the metal. All shear lines defining edges 14, 18, 20 are parallel. FIG. 5 depicts the strip after the first forming operation, wherein each arm 16 is formed along axes transversely of the shear lines defining edges 14, 18, 20 through a transition portion 24, so that most of each arm 16 is in a plane generally parallel to but displaced from the plane of the webs 12. Note that distal ends 27 are coined to facilitate mating. Subsequent to this operation, each contact is formed along an axis proximate to and paralleling the shear line defining second edge 16 to yield the generally tubular configuration of a socket contact (FIG. 1).

Figure 6:
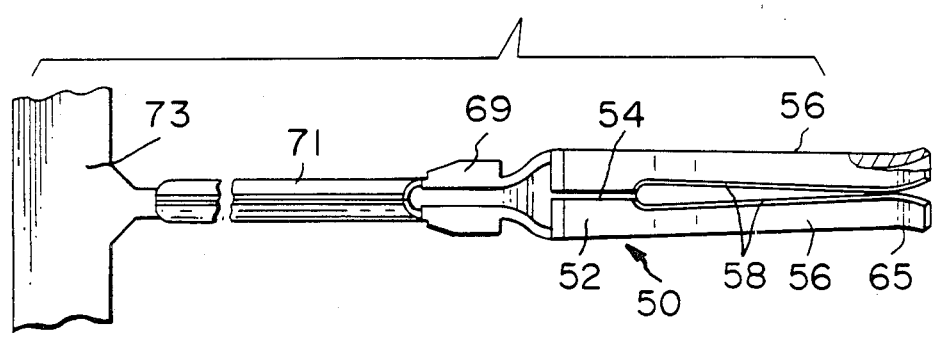
FIG. 6 is a plan view of the prior art socket.
Figure 7:
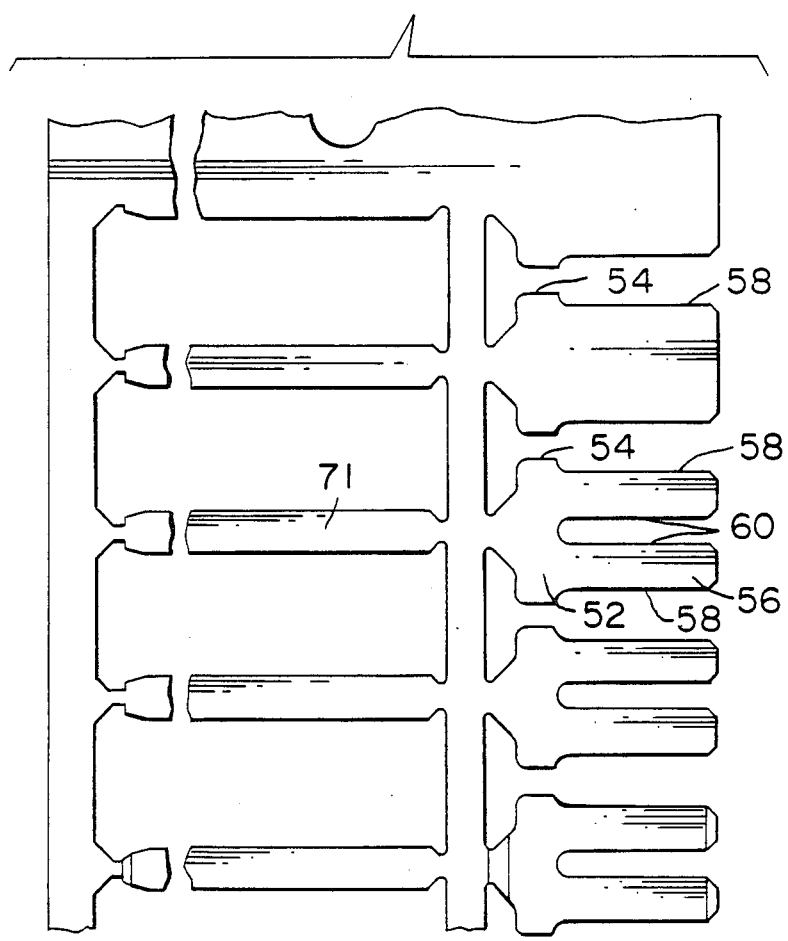
FIG. 7 is a plan view of the prior art stamping.

FIG. 6 shows a prior art socket contact 50 having arms 56 extending from a web 52, which cantilever arms 56 are readily distinguished from the present invention by absence of a diverging transition portion. Rather, the arms 56 converge directly from web 52 to constriction 65. Referring also to FIG. 7 which shows the die progression, first edges 58 are spaced apart by virtue of being stamped offset from first edges 54 of the web, while second edges 60 are spaced by blanking metal therebetween. The web 52 is considerably wider than the web 12, and considerably more scrap is generated by stamping blanks from between arms 56. The minimum centerline spacing which can be achieved is on the order of 0.150 inch, which is not a useful dimension for mass assembly in a housing having contact passages at 0.109 inch. At 0.217 inch centerlines, considerably more stock and gold plating are necessary, thus adding the cost of gold reclamation. The retaining plate 69, pin 71, and carrier strip 73 are not related to the present invention but could also be used with the inventive socket contact 10.

Referring to FIG. 8, there is disclosed a housing of the type disclosed in copending application serial number 806,141 filed Dec. 6, 1985 in which housing 110 has a mating face 112 surrounded by mating flange 114, an opposed rear face 115, and a mounting face 120 having stand-offs 122 which are secured to circuit board 102 by hardware received through holes 123 in mounting flanges 121. The holes 123 are profiled with bumps to snugly accommodate a rivet regardless of diameter variations within manufacturing tolerance, thus acting as a precision aligning feature. The housing 110 is injection molded of high temperature plastic with parallel rows of contact receiving passages 124 extending between faces 112, 115. A rib 116 extends across the rear face 115 below passages 124, the rib 116 having channels 117 spaced the same distance apart as the centerline spacing of the passages 124. Core holes 136 conserve material, assure uniform cooling of the plastic after molding and allow for drainage of vapor phase reflow fluids. Notch 138 facilitates robotic handling and positioning of the connector.

Typical stamped and formed metal contacts 10 each have a socket 142 and a retaining plate 29 which are received in a respective passage 124, the plate 29 being stepped down from socket 142 through neck 28.

The insertion feature can be used on any type of terminal contact, with any type of termination and inserted axially along the terminal contact from either direction.

Retentions means are formed on plate 29. The retention means shown are scalloped edges 31 terminating in barbs 172. Scalloped edges 31 are tapered, diverging from the centerline of retaining plate 29 rearward of the insertion direction of a terminal in a terminal receiving cavity or passage 124. The tapered shape of edges 31 facilitate insertion of a terminal 10 into a passage 124. Upon insertion, barbs 172 which extend beyond the distance between sidewalls 132 in passage 124 plow through the housing plastic forming sidewalls 132 and the plastic flows around barbs 172 for retention of contact 10 in passage 124 by an interference fit. The resistance to insertion that must be overcome is thus in plate 29 and hence the plane thereof. Barbs 172 bite into the walls of passage 124 to stabilize contact 10 in the passage and to prevent withdrawal of contact 10.

Insertion feature 150 comprising hump 32 is incorporated in retaining plate 29 of contacts 10 for applying an insertion force to insert contacts 10 into a terminal receiving passage 124 of an electrical connector without causing the contact to skive the interior surface of passage 124. A portion of retaining plate 29 is formed out of the plane thereof defining a vertical surface 151 facing opposite to the direction of insertion of contact 10 in passage 124. Vertical surface 151 is normal to retaining plate 29 and does not deform during insertion of contact 10. Insertion feature 150 is formed along a length of contact 10 in the direction of insertion from the vertical surface sufficient to withstand the insertion force without shearing. The length of insertion feature 150 will vary depending upon the material, thickness, shape and insertion forces to be withstood. Insertion feature 150 substantially transfers the insertion force applied to vertical surface 151 to be coplanar with the resistance to insertion of contact 10 in passage 124 introduced by scalloped edges 31. In this manner, insertion feature 150 is formed in contact 10 in the region where resistance to insertion is encountered. Insertion means 150 extends along contact 10 in the direction of insertion of contact 10 in passage 124 from surface 151 terminating in retaining plate 29 as leading edge 174. In the preferred embodiment leading edge 174 is shown as being arcuate, but may take on other shapes. Leading edge 174 can be a sheared line segment formed into a surface similar to surface 151.

In a preferred embodiment, vertical surface 151 is formed from a sheared line segment in the strip stock during formation of contact 10. Vertical surface 151 as shown in arcuate and more preferably semicircular. Vertical surface 151 extends upward from the upper surface of retaining plate 29 approximately three times the thickness of plate 29, forming a cylindrical structure in the preferred embodiment.

As shown in FIG. 9, insertion feature 150 is formed early in the progression. Vertical surface 151 is then used as a datum reference from which other features of contact 10 are spaced during manufacturing.

Behind plate 29 a cantilever arm 154 extends to a bend 156, which is formed through 105 degrees from the plane of the strip stock. A solder tail 40 extends from bend 156 to distal end 161 which is received against a solder pad on trace 104 on the board. The solder tails 40 of the contacts 10 received in the lower row of passages 124 are shorter than the solder tails of the contacts received in the upper row of passages. Each tail 40 is formed with a portion 160 of generally V-shaped cross section which is received in a respective channel 117.

Referring also to FIG. 9, socket contacts 10 in strip form are stamped and formed either on centerline or on a multiple thereof. The carrier strip 34 is located intermediate opposite ends of the contact and has partitions 162 extending between solder tails 40 and attaching to tail strip 163 adjacent distal ends 161. This arrangement permits plating ends 161 but leaves them protected against damage during handling. The contact strip shown is intended for the top row of passages 124; for other rows, tails 40 would be shorter.

Figure 12A:
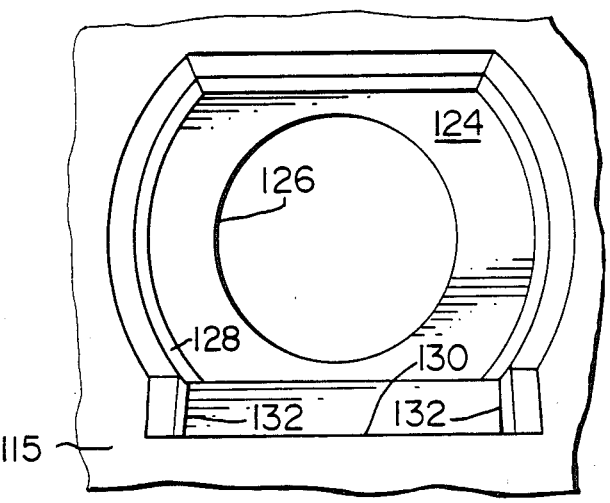
FIG. 12A is an enlarged rear view of a contact passage.
Figure 12B:
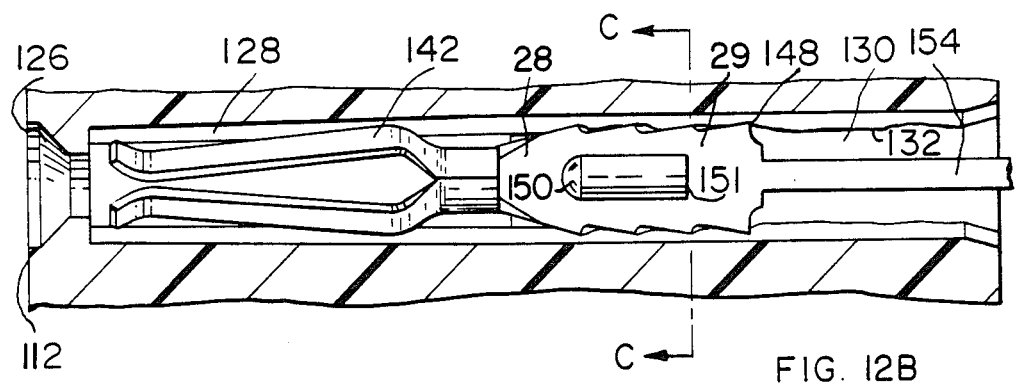
FIG. 12B is an enlarged plan section of the contact retention feature.
Figure 12C:
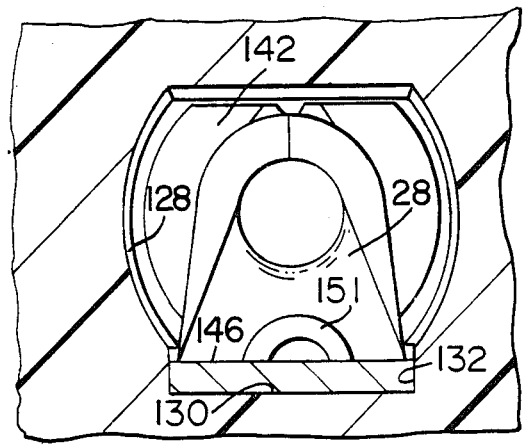
FIG. 12C is an enlarged rear section of the retention feature, taken along line C—C of FIG. 5B.

Referring to FIGS. 11A and 12A, each passage 124 consists of an upper portion 128 having arcuate sidewalls which converge toward pin-receiving lead-in 126, and a subfloor 130 toward rear face 115, the subfloor 130 being flanked by sidewalls 132 which likewise converge, and have a dovetail profile to urge plate 29 against subfloor 130 (FIG. 12C). FIG. 11B shows contacts 10 assembled to housing 110, the V-shaped portions 160 on solder tails 40 being received in respective channels 117 at half of the centerline spacing of passages 124 as there are two rows of passages 124, which corresponds to the spacing of traces 104 on board 102. Mounting hardware in the form of rivet 125 as shown in FIG. 11B is used to attach the housing 110 to board 102 prior to soldering tails 40 to solder pads on traces 104.

To assemble the contacts 10 into housing 110, a "comb" of contacts corresponding to the number of passages 124 in a row or a portion thereof, in accordance with known techniques, is severed from the continuous strip, and the tails 40 are formed through approximately 105 degrees at a predetermined distance from vertical surface 151. The sockets 142 are then partially inserted en masse into the row of passages 124, and the carrier strip 34 is blanked off along shear lines between indexing holes 35. The sockets 142 of contacts 10 are then fully inserted into passage 124 by pushing against the vertical surfaces 151 of insertion feature 150.

Figure 14:
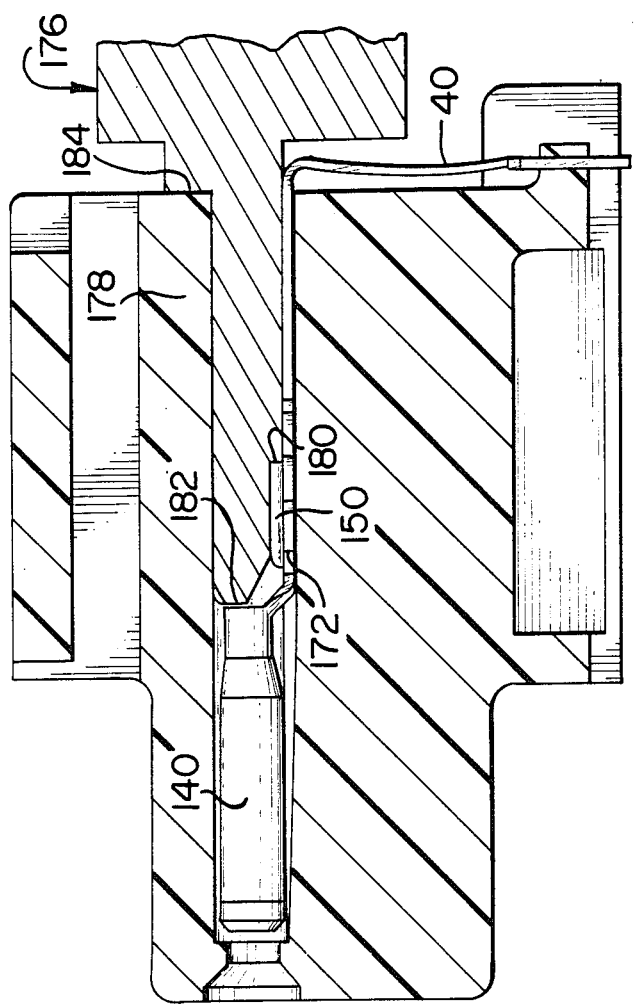
FIG. 14 is a side section of the housing and contact insertion tooling.

Contacts 10 are inserted in passages 124 as shown in FIG. 14. Tool 176 has member 178 for extending into each passage 124 in which a terminal 10 of the comb is to be inserted. Member 178 is recessed to accommodate passing over insertion feature 150 with surface 180 that engages vertical surface 151 to apply the insertion force to vertical surface 151 and thereby push contacts 10 into passages 124. The distal end 182 of member 178 clears the web of contact 10. Should vertical surface 151 distort or should insertion feature 150 shear, distal end 182 can assist inserting contact 10 into passage 124. The thickness of member 178 when combined with the thickness of contact 10 is substantially the height of passage 124 which further assures that retaining plate 29 is inserted against subfloor 130.

Contacts 10 can be inserted to a precise location by appropriately positioning stop 184 on tool 176. During contact 10 insertion, when stop 184 engages rear face 115, contact 10 is precisely positioned axially within passage 124 and movement of contact 10 axially within passage 124 ceases. Scalloped edges 31 on retaining plate 29 hold contact 10 where positioned by tool 176 during insertion. Since all features of contact 10 were referenced to vertical surface 151 during manufacturing as well as the forming of tails 40 during the assembly, the position of all features of contact 10, including the location of distal ends 161 of solder tails 40, is precisely known. The procedure is then repeated for the other contacts as required.

FIGS. 12B and 12C show the socket 142 fully inserted in upper passage portion 128, the plate 29 being received flushly against subfloor 130 with scalloped edge surfaces 31 received in interference between sidewalls 132. The plastic conforms to the profile of edge surfaces 31 to prevent axial withdrawal and also flows onto the rolled surface of plate 29 to prevent upward movement.

Figure 13A:
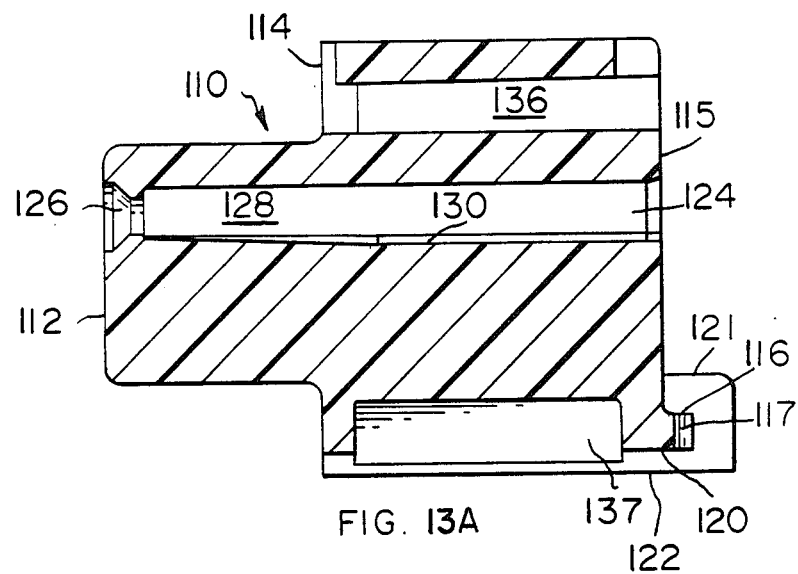
FIG. 13A is a side section of the housing.
Figure 13B:
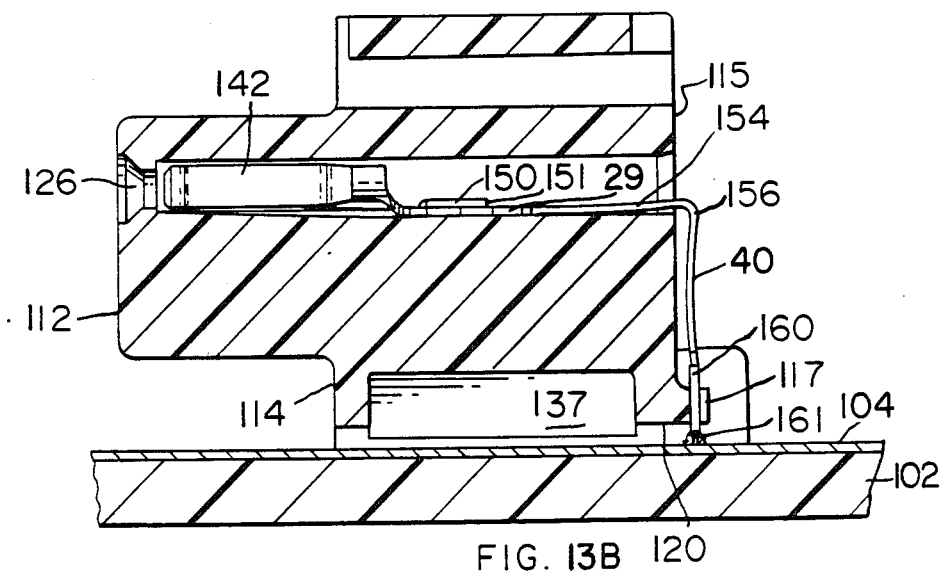
FIG. 13B is a side section of the housing loaded with terminals and assembled to a printed circuit board.

FIGS. 13A and 13B are side section corresponding to FIGS. 11A and 11B, taken through one of the passages 124 in the upper row. Bottom recesses 137, like the cored passage 136, is provided to assure uniform cooling of the plastic after molding. Since the plate 29 is received between sidewalls 132 in interference, it provides the anchoring point for each cantilever arm 154 and thus permits upward bending to assure compliance of distal ends 161 with respective traces 104 on the printed circuit board. The rib 116 and channels 117 therein are located along the edge of mounting face 120. Since only stand-offs 122 on end flanges 121 separate the rib 116 from the board 102, this assures that distal ends 161 will be spaced as channels 117 and likewise as traces 104. At the same time, the stand-offs 122 allow room for solder joints formed by reflowing solder pads on the traces 104. The distal ends 161 are arranged in a single exposed row which can readily be soldered by radiant or other line-of-sight heat source, as well as vapor phase soldering. The single exposed row also permits inspection of the solder joints.

I claim:

1. An electrical connector assembly, comprising an insulative housing having terminal receiving passages extending therethrough;

each of said passages having an electrical terminal disposed therein, said terminal comprising:
- a mating section;
- a terminating section;
- planar means for securing the electrical terminal in a terminal receiving passage in an interference fit; and
- insertion means integral with the planar securing means for inserting the electrical terminal into the terminal receiving passage, said insertion means having a surface normal to said planar securing means, whereby when a force is applied to the normal surface of the insertion means the electrical terminal is pushed into a respective terminal receiving passage.

2. An electrical connector assembly as recited in claim 1 wherein the normal surface is formed from a sheared line segment in the planar securing means.

3. An electrical connector assembly as recited in claim 1 wherein the insertion means extends along the electrical terminal in the direction of insertion from the rearward facing normal surface, terminating in the planar securing means in a leading edge.

4. An electrical connector assembly, comprising
an insulative housing having terminal receiving passages extending therethrough:

each of said passages having an electrical terminal disposed therein, said terminal comprising:
- a mating section;
- a terminating section;
- a retaining plate having scalloped edges for securing the electrical terminal in a terminal receiving passage in an interference fit, said scalloped edges diverging from the centerline of the retaining plate rearward of the insertion direction; and
- insertion means integral with the retaining plate for inserting the electrical terminal into the terminal receiving passage, said insertion means having a surface normal to the retaining plate, said surface facing rearward of the insertion direction, whereby when a force is applied to the rearward facing normal surface the electrical terminal is pushed into the terminal receiving passage.

5. An electrical connector assembly as recited in claim 4 wherein the rearward facing normal surface is formed from a sheared line segment in the retaining plate.

6. An electrical connector assembly as recited in claim 5 wherein the rearward facing normal surface is arcuate.

7. An electrical connector assembly as recited in claim 4 wherein the insertion means extends along the electrical terminal in the direction of insertion from the rearward facing normal surface terminating in the retaining plate in a leading edge.

8. An electrical connector assembly as recited in claim 7 wherein the leading edge is arcuate.

9. An electrical terminal for insertion into a terminal receiving passage in a dielectric housing, comprising:
- a mating section;
- a terminating section;
- a retaining plate having scalloped edges for securing the electrical terminal in a terminal receiving passage in an interference fit, said scalloped edges diverging from the centerline of the retaining plate rearward of the insertion direction; and
- insertion means integral with the retaining plate for inserting the electrical terminal into a terminal receiving passage, said insertion means having a surface normal to the retaining plate, said surface facing rearward of the insertion direction.

10. An electrical terminal as recited in claim 9 wherein the rearward facing normal surface is formed from a sheared line segment in the retaining plate.

11. An electrical terminal as recited in claim 10 wherein the rearward facing normal face is arcuate.

12. An electrical terminal as recited in claim 9 wherein the insertion means extend along the electrical terminal in the direction of insertion from the rearward facing normal surface terminating in the retaining plate in a leading edge.

13. An electrical terminal as recited in claim 9 wherein the leading edge is arcuate.

14. A method of inserting contacts into a connector housing to a predetermined position using a tool having a stop thereon, comprising the steps of
stamping a series of insertion features in a continuous strip of metal stock at regulr spacing;
stamping and forming the continuous strip of metal stock into a series of contacts each having an insertion feature with the insertion feature as a datum reference with respect to the other features of each contact;
severing a predetermined number of contacts from the continuous strip series of contacts;
forming tails of the severed contacts a predetermined distance from the insertion feature;
applying an insertion force to the insertion feature of the severed contacts using a tool to push the contacts into terminal receiving passages in a connector housing until the insertion feature is at a predetermined axial position within the passage, whereby the precise position of the inserted contacts is controlled.

15. A method of inserting contacts as recited in claim 14 further comprising the steps of
partially inserting the severed contacts into terminal receiving passages; and
severing the carrier strip, prior to applying an insertion force to the insertion feature.

16. A method of inserting contacts as recited in claim 14 wherein the step of applying an insertion force to the insertion feature to push the contacts into terminal receiving passages in a connector housing until the insertion feature is at a predetermined axial position within the passage further comprises applying the insertion force to the insertion feature until a stop on the insertion tool engages the connector housing.

* * * * *